(12) United States Patent
Takeshita

(10) Patent No.: US 7,619,426 B2
(45) Date of Patent: Nov. 17, 2009

(54) PERFORMANCE BOARD AND COVER MEMBER

(75) Inventor: Satoshi Takeshita, Tokyo (JP)

(73) Assignee: Advantest Corporation, Tokyo (JP)

( * ) Notice: Subject to any disclaimer, the term of this patent is extended or adjusted under 35 U.S.C. 154(b) by 100 days.

(21) Appl. No.: 11/864,928

(22) Filed: Sep. 29, 2007

(65) Prior Publication Data

US 2008/0231309 A1     Sep. 25, 2008

(30) Foreign Application Priority Data

Oct. 3, 2006     (JP) ............................. 2006-272070

(51) Int. Cl.
    *G01R 31/02*     (2006.01)
(52) U.S. Cl. ...................................... 324/755; 324/760
(58) Field of Classification Search ................. None
    See application file for complete search history.

(56) References Cited

U.S. PATENT DOCUMENTS

| 6,420,885 B1 * | 7/2002 | Fredrickson ................ 324/754 |
| 6,842,030 B2 * | 1/2005 | Kim et al. ................... 324/765 |
| 6,894,523 B2 * | 5/2005 | Neeb .......................... 324/765 |

FOREIGN PATENT DOCUMENTS

| JP | 7-260879 | 10/1995 |
| JP | 2000-147053 | 5/2000 |
| JP | 2000-147055 | 5/2000 |

* cited by examiner

*Primary Examiner*—Minh N Tang
(74) *Attorney, Agent, or Firm*—Osha • Liang LLP

(57) ABSTRACT

A performance board which is attached to a semiconductor test apparatus and on which devices under test are mounted is provided. The performance board includes: a substrate; sockets which are attached to the surface of the substrate and on which devices under test are mounted; and an adiathermic cover member attached to the rear surface of a region of the substrate on which the sockets are mounted.

15 Claims, 19 Drawing Sheets

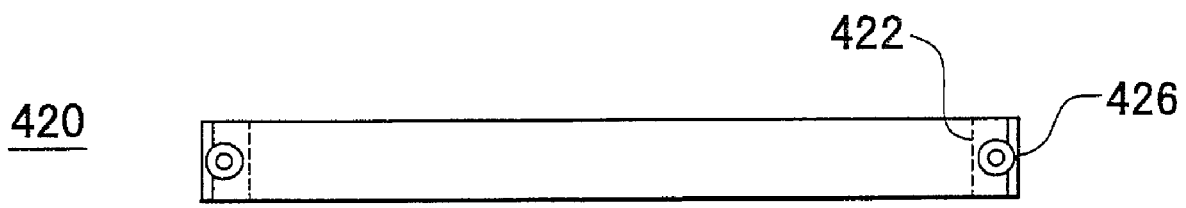
F I G . 11

PERFORMANCE BOARD AND COVER MEMBER

CROSS REFERENCE TO RELATED APPLICATION

The present application claims priority from a Japanese Patent Application No. 2006-272070 filed on Oct. 3, 2006, the contents of which are incorporated herein by reference.

BACKGROUND

1. Technical Field

The present invention relates to a performance board and a cover member. Particularly, the present invention relates to the performance board which is attached to a test head in a semiconductor test apparatus so as to be an interface between the test head and a device under test, and relates to a cover member which is used while being attached to the performance board.

2. Related Art

In usual semiconductor test apparatus, various tests targeting various devices under test are executed. Here, a semiconductor test apparatus is formed by combining a handler which accommodates, conveys and mounts the devices under test, a test head which forms an electrical connection to the devices under test and a mainframe which controls the whole operation and so forth. Additionally, the semiconductor test apparatus has a structure which can partially replace components in accordance with a target and a content of a test to be executed. Moreover, in the semiconductor test apparatus, an environmental test is also executed in addition to tests using various test signals, which operates the devices under test while the temperature environment is changed. Here, a high-temperature test and a low-temperature test which are executed as cooling or heating the devices under test will be generically described as "temperature test.

When a temperature test is executed in a semiconductor test apparatus, the temperature of a device under test should be kept a predetermined set temperature. Thus, a thermostatic chamber enclosed by a high-adiathermic material is provided in the semiconductor test apparatus, and then a test is executed while the device under test is accommodated in the thermostatic chamber. However, when a semiconductor is tested, it is also required that the device under test is connected to an electronic circuit disposed outside the thermostatic chamber. Therefore, various structures being capable of satisfying both of the adiathernanous and the electrical connection have been suggested.

Particularly, in the low-temperature test, the temperature of a part of the semiconductor test apparatus facing the cooled thermostatic chamber is decreased than that of the other portions. When such portion takes the air, dew condensation would be formed, and then the electrical circuit is wet due to the dew condensation, therefore electrical characteristic is changed thereby accuracy of the test is reduced. Thus, for the semiconductor test apparatus executing the low-temperature test, various suggestions with respect to structures or methods for preventing the dew condensation from forming have been provided.

A test apparatus including a structure that interfaces to devices under test are collectively accommodated in a high/low temperature chamber has been described as, for example, in 1) Japanese Patent Application Publication No. H7-260879. Thereby the temperature of the devices under test can be kept a predetermined test temperature, and the temperature within the high/low temperature chamber is prevented from affecting the test head of the semiconductor test apparatus.

In addition, a structure that a under surface of a thermostatic chamber providing a temperature environment of the devices under test is sealed has been described as, for example, in 2) Japanese Patent Application Publication No. 2000-147053. Thereby the dew condensation formed on the test head side can be prevented from forming when the interior of the thermostatic chamber is cooled.

Moreover, a structure that a space is provided below the base of a kind replacement section on which the devices under test are mounted has been suggested as, for example, in 3) Japanese Patent Application Publication No. 2000-147055. Thereby the temperature in the thermostatic chamber can be prevented from affecting the test head.

However, the structure described in 1) requires a large space between a conversion board attached to the test head and sockets on which devices under test are mounted. Therefore, the semiconductor test apparatus which can be tested are limited.

The structure described in 2) has a structure dedicated to a motherboard forming an interface on the test head side. Therefore, the structure of the thermostatic chamber which can be combined with the motherboard is limited, so that the semiconductor test apparatus's own structure should be changed.

Moreover, the structure described in 3) requires a large space between the test head and the thermostatic chamber. Therefore, the specification of the semiconductor test apparatus being capable of embodying the structure is limited.

As described above, there has been a problem that the structures of a semiconductor test apparatus which executes a temperature test and those components tend to be large. In addition, there also has been a problem that a cost is increased because such as motherboard's own structure should be changed.

SUMMARY

Therefore, it is an object of an aspect of the present invention to provide a performance board and a cover member, which are capable of overcoming the above drawbacks accompanying the related art. The above and other objects can be achieved by combinations described in the independent claims. The dependent claims define further advantageous and exemplary combinations of the present invention.

According to a first aspect related to the innovations herein, one exemplary performance board which is attached to a semiconductor test apparatus and on which devices under test are mounted is provided. The performance board includes: a substrate; sockets which are attached to the surface of the substrate and on which the devices under test are mounted; and an adiathermic cover member which is attached to the rear surface of a region of the substrate on which the sockets are mounted.

According to a second aspect related to the innovations herein, one exemplary cover member is provided. The cover member is attached to the performance board of the semiconductor test apparatus which includes: the substrate; and the sockets which are attached to the surface of the substrate and on which the devices under test are mounted. The cover member is attached to the rear surface of the region of the substrate on which the sockets are mounted.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 11 is a side view showing a shape of the side wall 420 of the cover member 400;

DESCRIPTION OF EXEMPLARY EMBODIMENTS

Some aspects of the invention will now be described based on preferred embodiments, which do not intend to limit the scope of the invention, but exemplify the invention. All of the features and the combinations thereof described in the embodiments are not necessarily essential to the invention.

Figure 1:
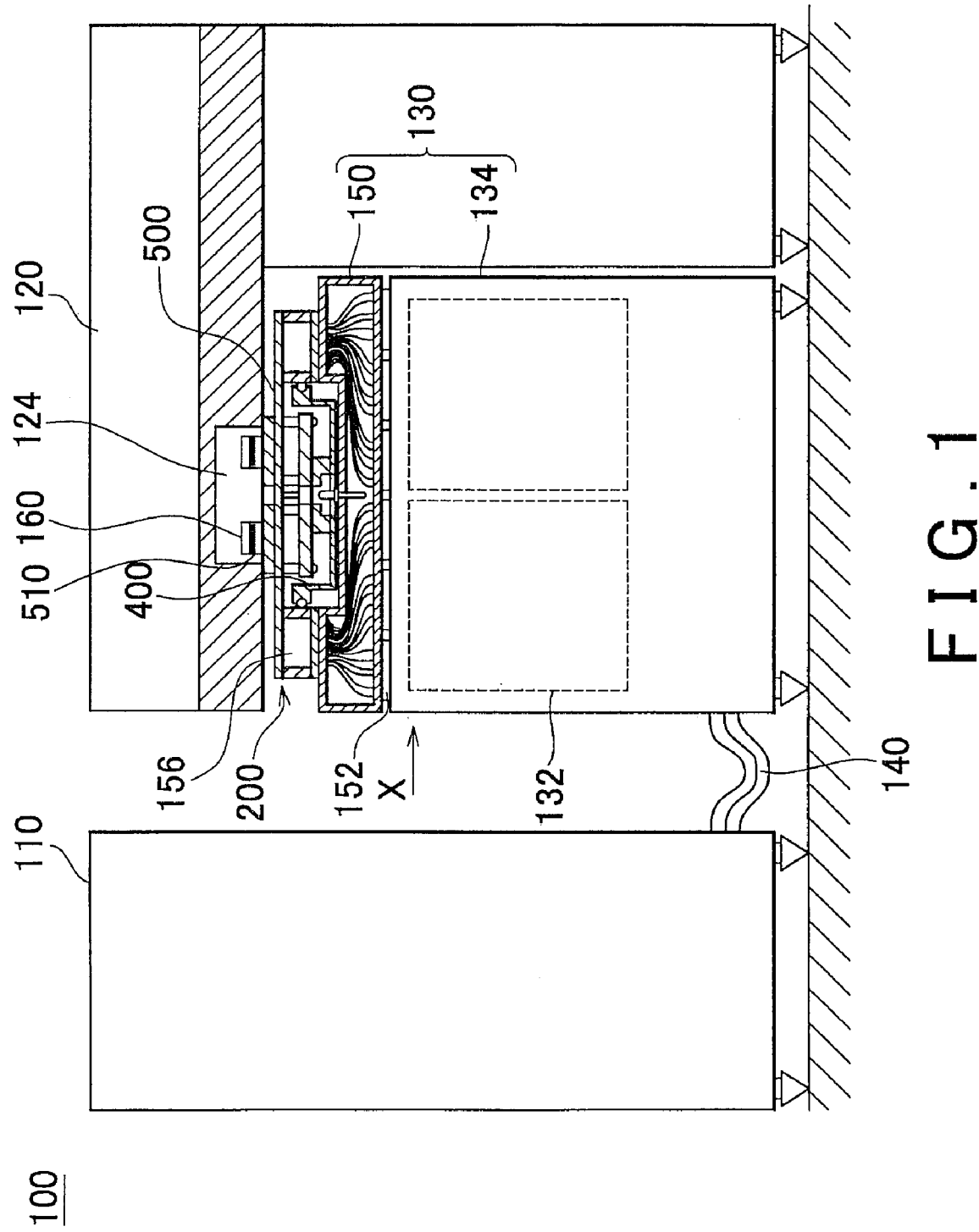
FIG. 1 is a drawing showing typically the whole structure of a semiconductor test apparatus 100 according to an embodiment.

FIG. 1 is a drawing showing typically the whole structure of a semiconductor test apparatus 100 using a performance board 200 according to an embodiment. As shown in FIG. 1, the semiconductor test apparatus 100 is formed by combining a mainframe 110, a handler 120, a test head 130, a connection cable 140 and so forth.

The mainframe 110 is a kind of information processing apparatus including a power supply, a timing generator and a bus controller and so forth and controls the operation of the whole semiconductor test apparatus 100. Meanwhile, a handler 120 mainly mechanically operates to provide devices under test 160 to the test head 130 described later, classify the tested devices under test 160 and store therein those. The test head 130 establishes an electrical connection to each device under test 160 to execute tests.

In the above-described semiconductor test apparatus 100, the devices under test 160 are mounted on the performance board 200 attached to the top of the test head 130 to execute the test. The test head 130 includes a cabinet 134 accommodating therein test circuit cards 132 and so forth and a motherboard 150 attached to an upper surface of the cabinet 134. The performance board 200 is attached to the top surface of the motherboard 150.

The performance board 200 is provided with a substrate 500 having sockets 510. The devices under test 160 are mounted onto the sockets 510 by the handler 120. Here, a thermostatic chamber 124 is provided in a portion of the handler 120 which is overhung above the test head 130. The thermostatic chamber 124 is a location where tests are executed while devices under tests 160 are cooled or heated. The thermostatic chamber 124 includes a heating means and a cooling means, and is thermally insulated from the environment by an insulation material.

Figure 2:
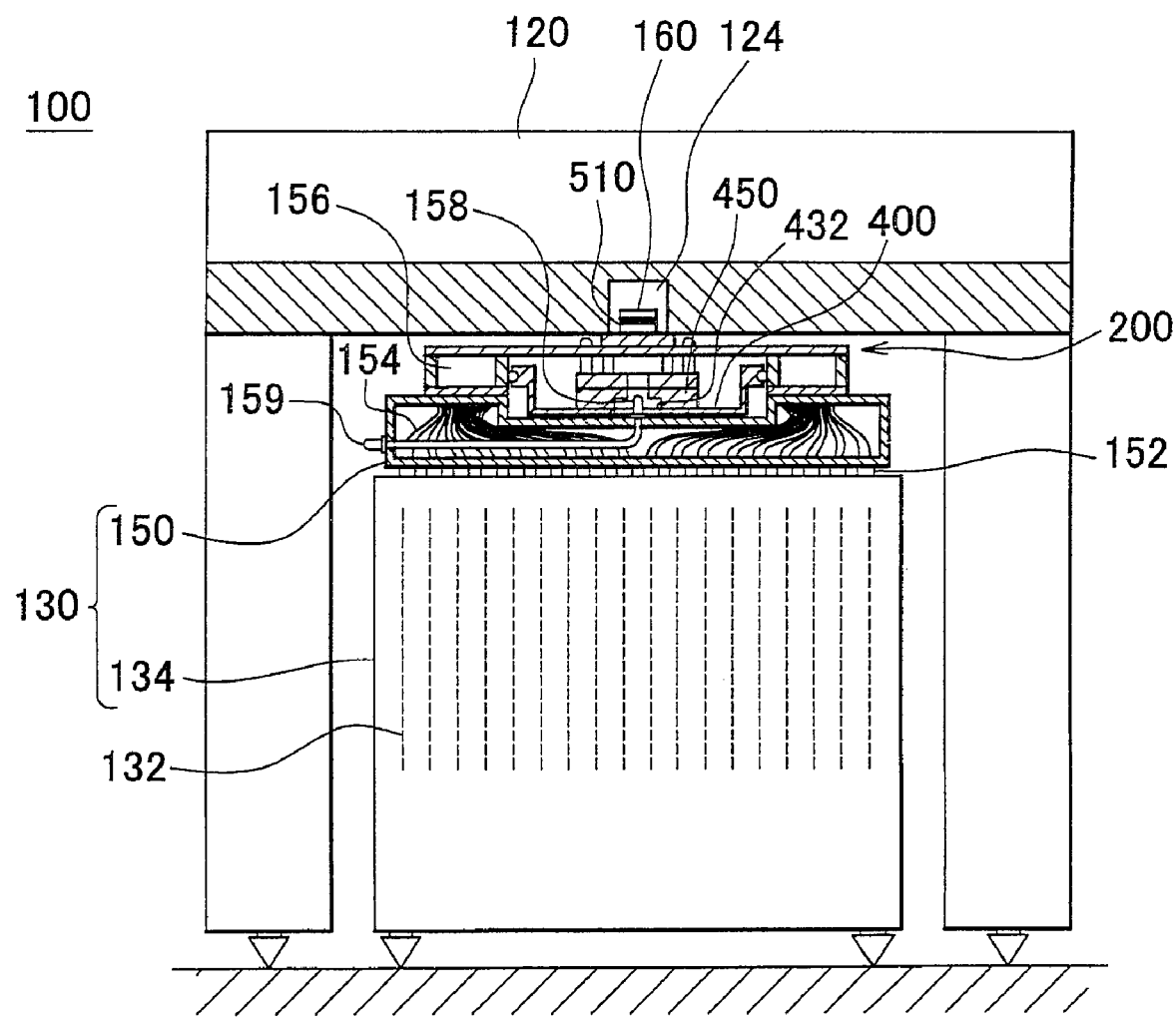
FIG. 2 is a drawing showing a handler 120 and a test head 130 of the semiconductor test apparatus 100 viewed at a different angle.

FIG. 2 is a drawing showing the handler 120 and the test head 130 of the semiconductor test apparatus 100 viewed from a direction indicated by an arrow X in FIG. 1. Viewing from the direction as shown in FIG. 2, test circuit cards 132 accommodated in the cabinet 134 of the test head 130 are arranged in parallel with each other. Accordingly, any test circuit card 132 can be individually removed and replaced. In addition, a connector is formed on the upper end of each of the test circuit cards 132 (not shown in the figure), which can be connected to each abutment connector 152 on the under surface of a motherboard 150.

Here, the motherboard 150 includes an air plug 159 and an air nozzle 158 which are communicated with each other. Thereby the air plug 159 can be connected to a dry air tank (not shown in the figure) to discharge the dry air from the air nozzle 158. The dry air discharged from the air nozzle 158 is blown against the substrate 500 on the performance board 200 on the rear surfaces of the sockets 510. Thereby dew condensation is prevented from forming in this region.

In addition, a detachable cover member 400 is attached to the under surface of the performance board 200. When a temperature of the thermostatic chamber 124 is higher or lower than the surrounding temperature, the heat is propagated from pins or receptacles of the sockets 510 usually made of metal to the outside. Therefore, temperature distribution is formed close to the sockets 510 in the thermostatic chamber 124, or the heat is propagated to the rear surface of the substrate 500. In response to that, the cover member 400 covers the rear surfaces of the sockets 510 to prevent the heat from dissipating, so that the temperature of the thermostatic chamber 124 is stabilized.

An injection hole 432 is formed on a bottom section 430 of the cover member 400. Thereby a dry air discharged from the air nozzle 158 is injected into the cover member 400. Thereby dew condensation is prevented from forming in the cover member 400. Here, the cover member 400's own structure and mounting it to the performance board 200 will be described in detail later.

Figure 3:
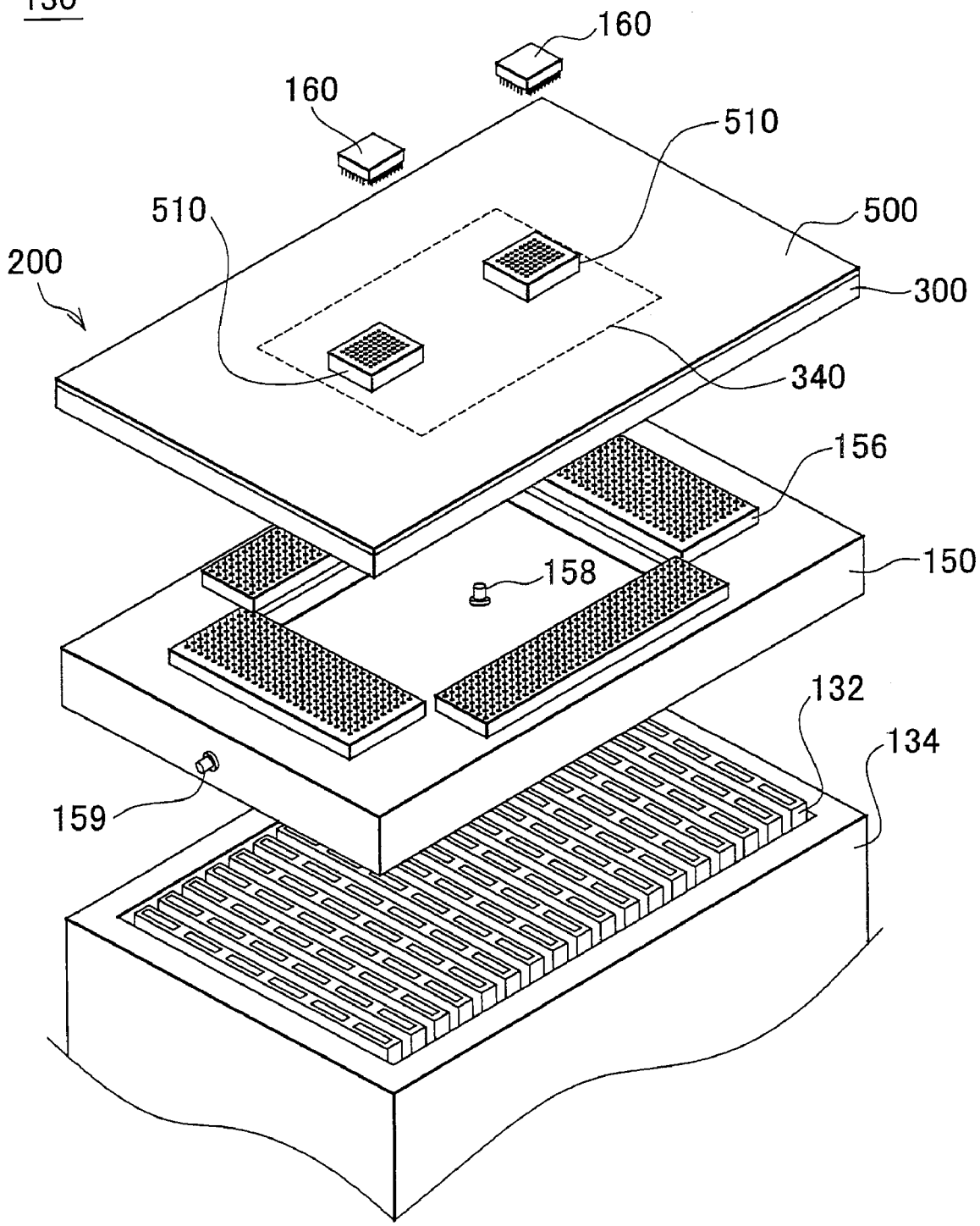
FIG. 3 is an exploded perspective view showing a structure close to the top of the test head 130 of the semiconductor test apparatus 100.

FIG. 3 is an exploded perspective view showing a stacked structure close to the top of the test head 130. As shown in FIG. 3, the upper ends of the test circuit cards 132 accommodated in the cabinet 134 expose to the upper surface of the cabinet 134 of the test head 130. The motherboard 150 is attached to the test circuit cards 132. In addition, the performance board 200 is stacked on the top surface of the motherboard 150. The performance board 200 includes the sockets 510 on the top surface thereof, and the devices under test 160 are mounted onto the sockets 510. Here, the cover member 400 is attached to the under surface of the performance board 200, so that it does not appear in FIG. 3.

Figure 4:
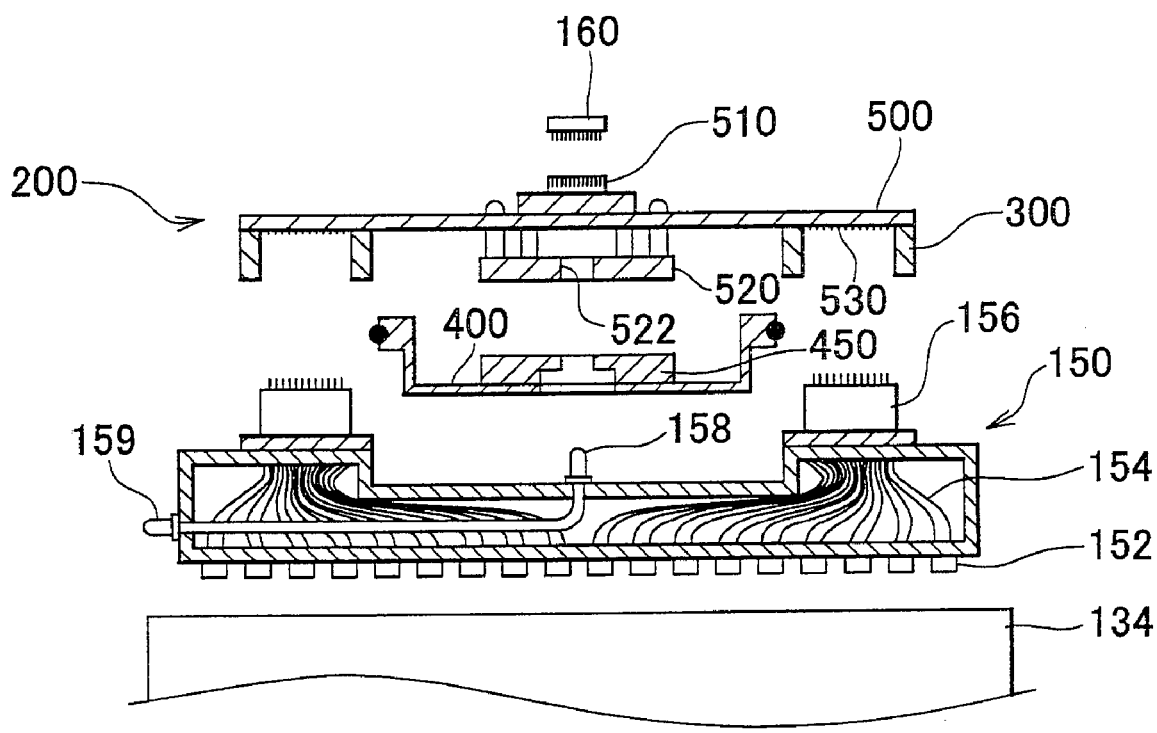
FIG. 4 is a cross sectional view showing a structure of the test head 130 from a lateral direction.

FIG. 4 is a cross sectional view typically showing an electrical coupling structure from the test head 130 to the devices under test 160. As shown in FIG. 4, the motherboard 150 is connected to the test circuit cards 132 in the cabinet 134 through the abutment connector 152 mounted on the under surface of the motherboard 150. In addition, the abutment connector 152 of the under surface is connected to abutment connector 156 on the top surface through coaxial cable 154 in the interior of the motherboard 150.

The substrate 500 of the performance board 200 is provided with a contact pad 530 on the under surface thereof When the performance board 200 is stacked on the motherboard 150, the abutment connector 156 and the contact pad 530 are electrically connected by abutting on each other. The substrate 500 of the performance board 200 has a wiring (not shown in the figure) which electrically connects the contact pad 530 and the sockets 510. Accordingly, by mounting the devices under test 160 onto the sockets 510, a range from the test circuit cards 132 of the test head 130 to the devices under test 160 is electrically connected.

By such stacked structure, the test circuit cards 132 can be replaced without replacing the other components of the semiconductor test apparatus 100. In addition, even if the type of the devices under test 160 is changed, the test circuit cards 132 can be replaced by replacing the performance board 200 without replacing the other components of the semiconductor test apparatus 100. Accordingly, various tests are executed on various devices under test 160 while many components are continuously used, so that the effective cost of the semiconductor test apparatus 100 can be reduced.

Figure 5:
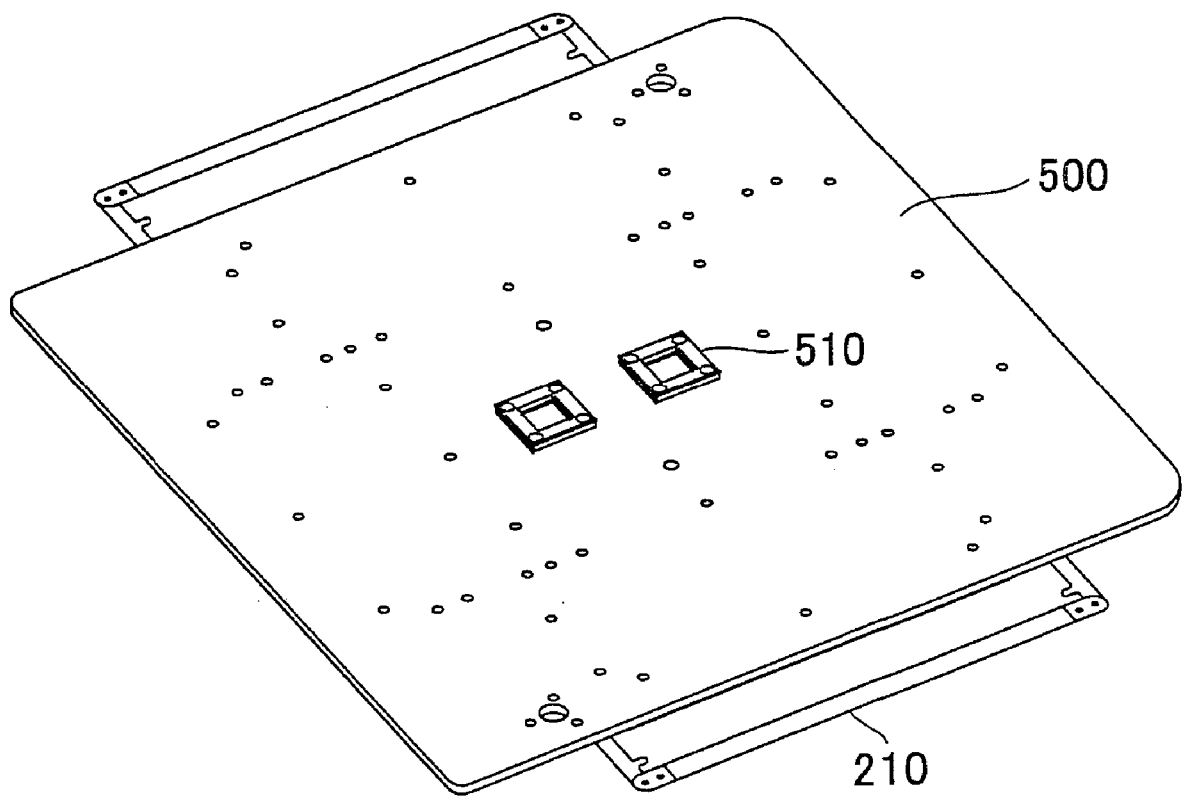
FIG. 5 is a perspective view showing a performance board 200 viewed from an obliquely upward direction.

FIG. 5 is a perspective view showing solely the performance board 200 viewed from an obliquely upward direction. As shown in FIG. 5, the performance board 200 is provided with the substrate 500 on the top surface thereof. In addition, a pair of sockets 510 is attached to around the center of the substrate 500. Further, the performance board 200 includes a pair of handles 210 on both sides thereof, which is grasped by a user who handles the performance board 200.

Figure 6:
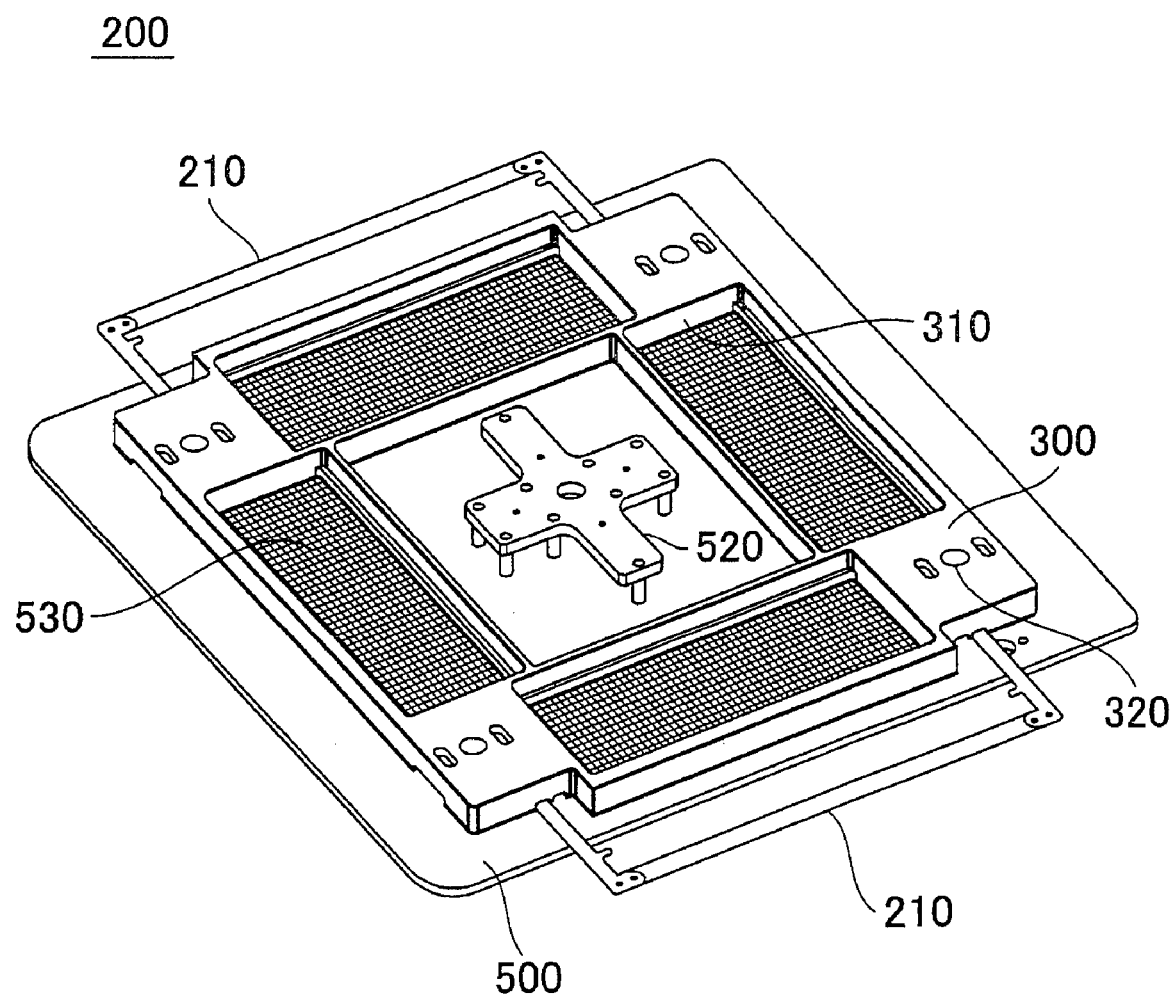
FIG. 6 is a drawing showing a rear surface of the performance board 200 viewed from an obliquely upward direction.

FIG. 6 is a drawing obtained by reversing the performance board 200 as shown in FIG. 5 and viewed from an obliquely upward direction. Here, the cover member 400 has not been attached to the performance board 200 shown in FIG. 6 yet, however, the performance board 200 can enough be used as a performance board 200 under this condition.

As shown in FIG. 6, a stiffener 300 is attached to the rear surface of the substrate 500. The above-described handle 210 is attached to the stiffener 300. Thereby the mechanical strength of the performance board 200 is improved, and the performance board 200 can be prevented from being deformed when the devices under test 160 are repeatedly mounted thereon.

In addition, a stiffener plate 520 is attached to the center of the backside of the substrate 500 on the rear surface of the performance board 200. The stiffener plate 520 is a member for reinforcing the bending strength of the substrate 500 and attached to the rear surface of the region on which the sockets 510 are mounted. Thereby it resists the force applied to the substrate 500 when the devices under test 160 are inserted/removed to/from the sockets 510 so that the substrate 500 is prevented from being deformed. Here, the stiffener plate 520 is attached in non-contact with the rear surface of the substrate 500 through a curler 610. Thereby the rear surface of the socket 510 can be accessed on the rear surface of the substrate 500. In addition, an injection hole 522 is formed at the center of the stiffener plate 520, so that the dry air discharged from the air nozzle 158 can be directly blown against the rear surfaces of the sockets 510.

Figure 7:
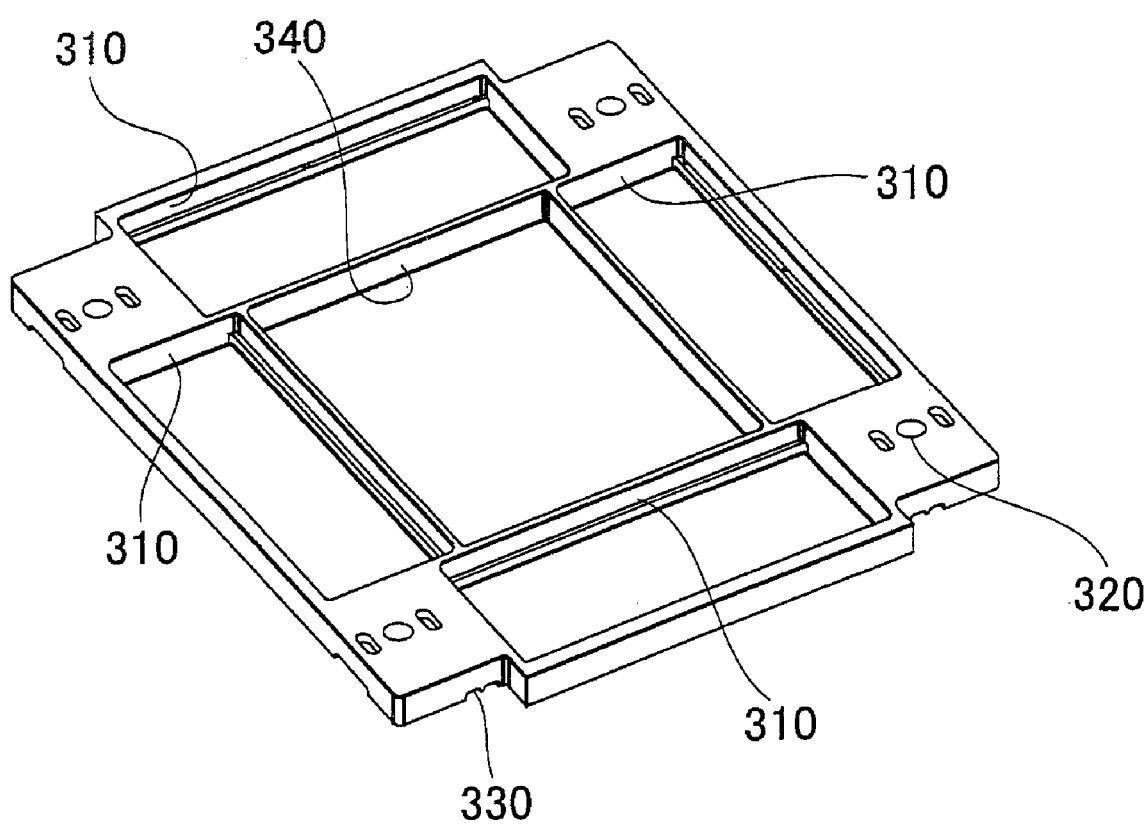
FIG. 7 is a drawing showing solely a shape of a stiffener 300.

FIG. 7 is a drawing showing solely a shape of the stiffener 300. As shown in FIG. 7, the stiffener 300 has a size slightly smaller than that of the substrate 500 and is integrally formed by a thick metal plate. Threaded holes 320 through which screws 478 (not shown in the figure) for fixing the substrate 500 are inserted are formed close to the four corners of the stiffener 300, respectively. In addition, a center hole section 340 and surrounding hole section 310 which penetrate the stiffener 300 in the depthwise direction are formed at the center and on regions along the four sides of the stiffener 300. Moreover, mount sections 330 for mounting the handle 210 are formed on the four side surfaces.

Referring to FIG. 6 again, a contact pad 530 is exposed to the inside of each of the surrounding hole sections 310 when the above-described stiffener 300 is attached to the substrate 500. In addition, the rear surface of the region of the substrate 500 on which the sockets 510 are mounted is exposed inside of the center hole section 340.

Figure 8:
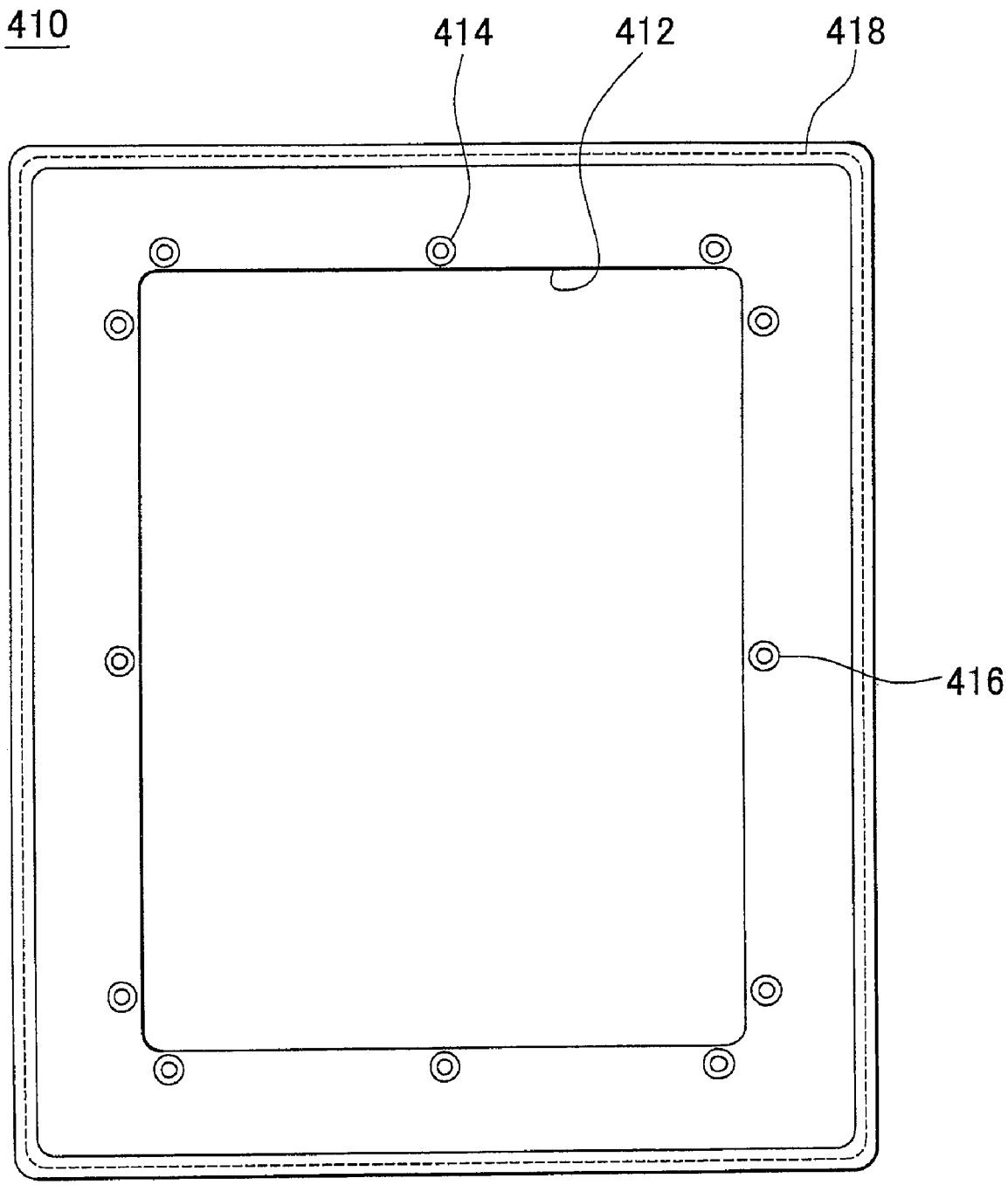
FIG. 8 is a plan view showing a shape of a frame 410 of a cover member 400.

FIG. 8 is a plan view showing a shape of a frame 410 forming apart of the covermember 400. As shown in FIG. 8, the frame 410 has a large opening 412 at the center thereof In addition, a plurality of threaded holes 414 and 416 are formed on the four sides, respectively. Those threaded holes 414 and 416 are used to attach the frame 410 to side walls 420 and 440 described later.

Figure 9:
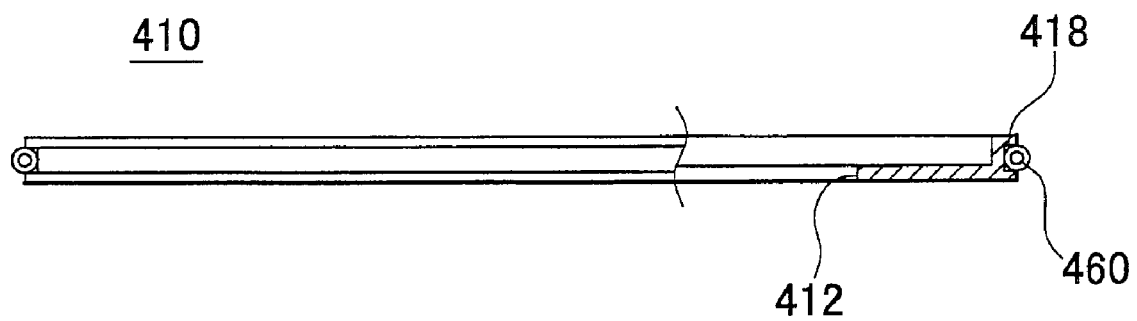
FIG. 9 is a side view showing a shape of the frame 410 of the cover member 400.

FIG. 9 is a sideview showing the side shape of the frame 410. In addition, apart of FIG. 9 shows the longitudinal section of the frame 410. As shown in FIG. 9, a continuous groove 418 is formed on the side surface of the frame 410. In addition, an O ring 460 made of an elastic material such as silicon rubber is fitted into the groove 418. Thereby the O ring 460 is tightly in contact with both of the frame 410 and the performance board 200 to tightly seal therebetween when the cover member 400 with the frame 410 is attached to the performance board 200. In addition, a thermal conduction between the cover member 400 and performance board 200 is restrained by attaching the cover member 400 through the O ring 460 because usual elastic members have low thermal conductivity.

Here, it is preferred that the O ring 460 can maintain its elasticity at the temperature about −55 degree centigrade to 150 degree centigrade where an environmental test is executed, and is made of a chemically stabilized material. Specifically, silicon rubber may be used, for example, however, it is not limited to that.

Figure 10:
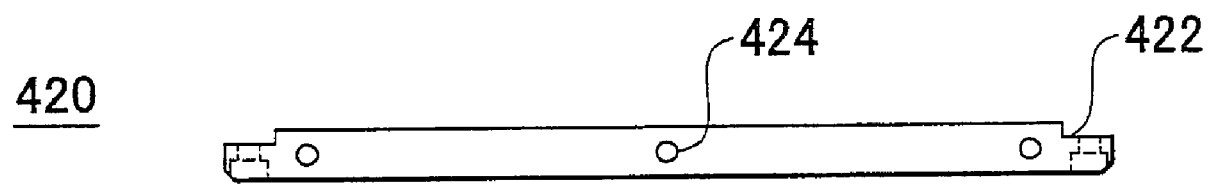
FIG. 10 is a plan view showing a shape of a side wall 420 of the cover member 400.

FIG. 10 is a plan view showing a shape of the side wall 420 forming a part of the cover member 400. As shown in FIG. 10, the side wall 420 is a long board and has a plurality of threaded holes 424 into which screws 474 described latter are inserted. In addition, a pair of notches 422 of which thickness is reduced is formed on the both ends of the side wall 420 in a longitudinal direction.

FIG. 11 is a side view showing a shape of the side wall 420 of the cover member 400 as show in FIG. 10. As shown in FIG. 11, a threaded hole 426 having one end which opens on the notch 422 is formed on the region in which the notch 422 is formed.

Figure 12:
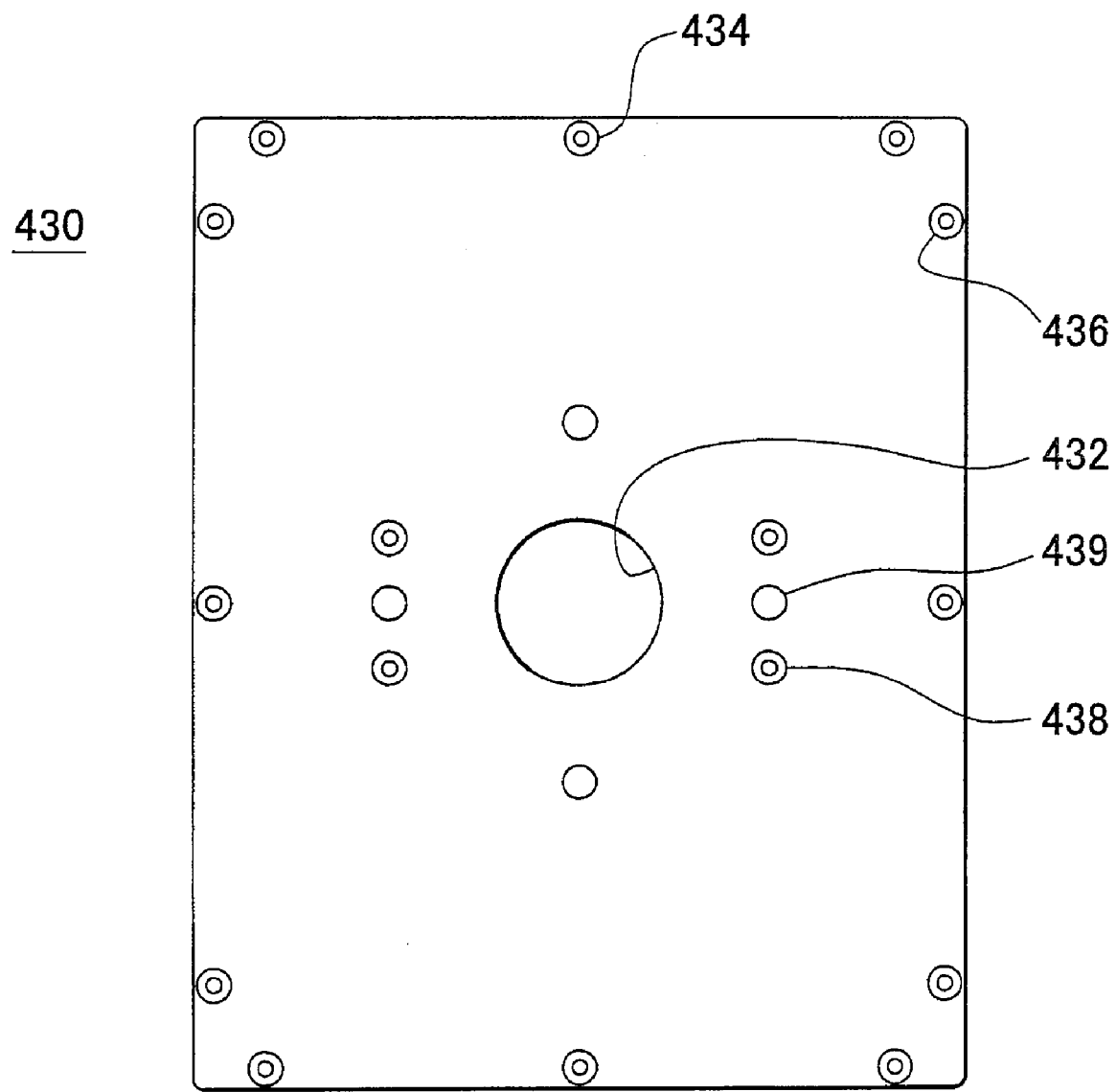
FIG. 12 is a plan view showing a shape of a bottom section 430 of the cover member 400.

FIG. 12 is a plan view showing a shape of a bottom section 430 forming a part of the cover member 400. As shown in FIG. 12, the bottom section 430 is substantially a rectangular board as a whole and has a number of threaded holes 434, 436 and 438, and work holes 439. An intended use of those will be sequentially described later. In addition, a circular opening to be an injection hole 432 is formed at the center of the bottom section 430.

Figure 13:
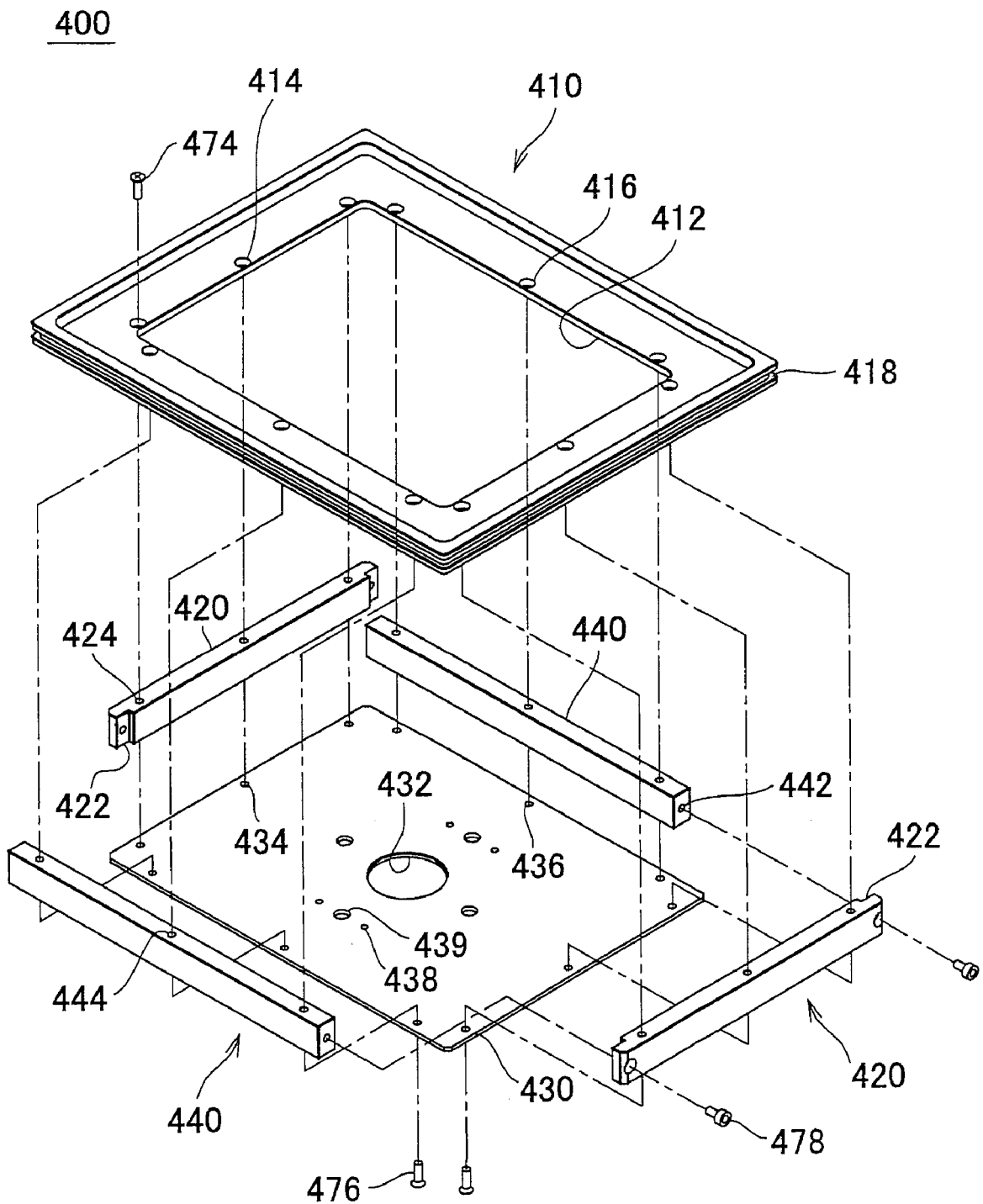
FIG. 13 is an exploded perspective view showing a built-up structure of the cover member 400.

FIG. 13 is an exploded perspective view showing a built-up structure of the cover member 400 using the frame 410, the side wall 420 and the bottom section 430 as shown in FIG. 8 to FIG. 12. Here, assembling the cover member 400, a pair of side walls 420 as shown in FIG. 10 and FIG. 11 are used, and also another pair of side walls 440 including a simple long board and a plurality of threaded holes 442 and 444 are used.

As shown in FIG. 13, four side walls of the cover member 400 can be integrally formed by positioning the side wall 440 by means of the notch 422 of the side wall 420, and inserting screw 478 through threaded hole 426 into threaded hole 442. Next, the frame 410, from above, and the bottom section 430, from below, are attached to the side walls, respectively to form the cover member 400 having the opening 412 on the top surface thereof. Here, the frame 410 is fixed by screws 474 inserted into the threaded holes 424 and 444 through the threaded holes 414 and 416. In addition, the bottom section 430 is fixed by screws 476 inserted into the bottom ends of threaded holes 424 and 444 through the threaded holes 434 and 436.

Here, the cover member 400 according to the present embodiment is assembled by individually manufacturing the frame 410, the side walls 420 and 440, and the bottom section 430, however, the cover member 400 may be integrally formed as a whole. Moreover, the components may be divided in different ways.

Figure 14:
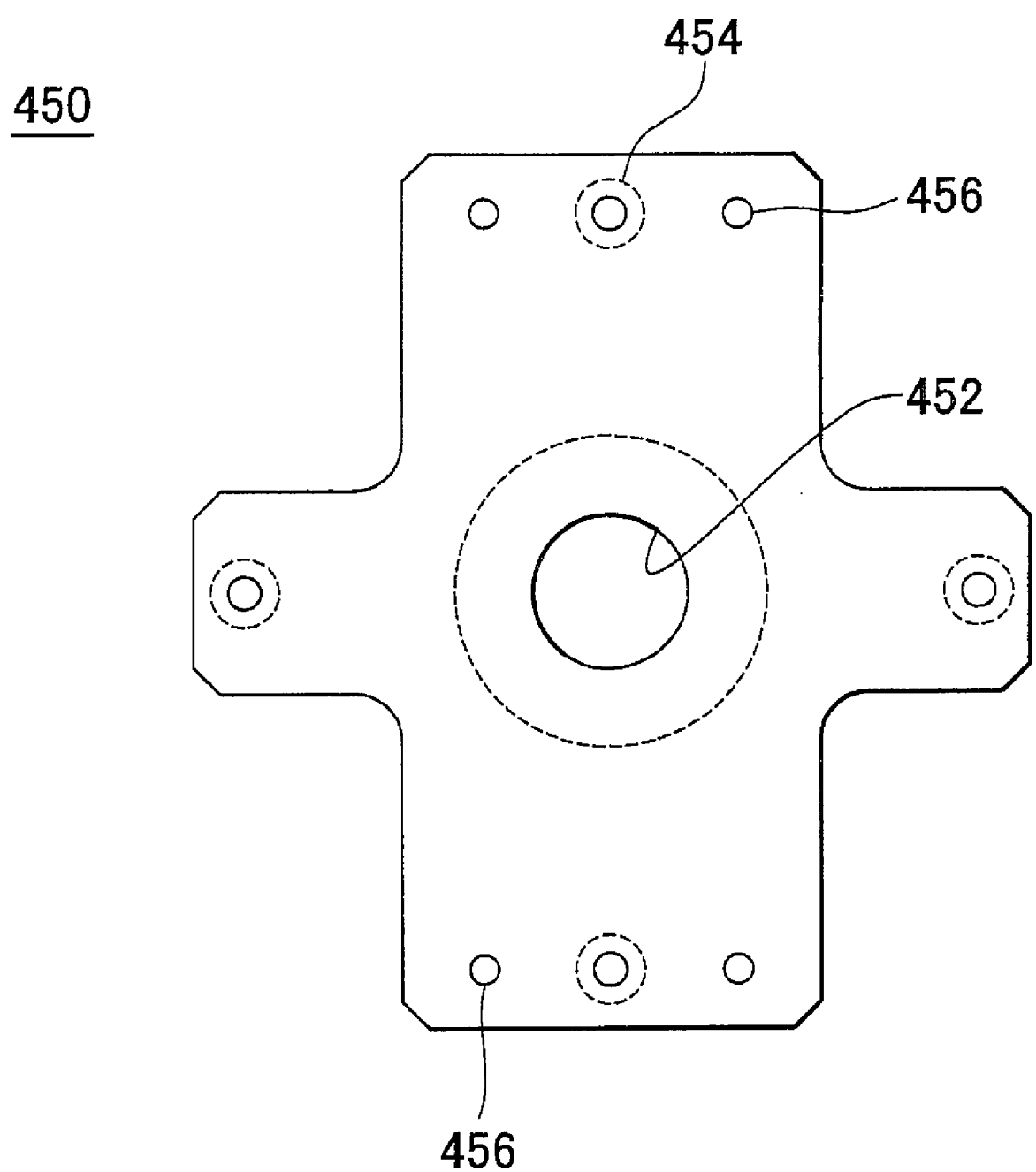
FIG. 14 is a plan view showing a shape of a spacer member 450 attached to the cover member 400.

FIG. 14 is a plan view showing a shape of a spacer member 450 attached to the cover member 400. As shown in FIG. 14, the spacer member 450 may be a board having the same shape as a part of the stiffener plate 520 mounted to the substrate 500. A plurality of threaded hole 454 and 456 are formed close to the edge of the spacer member 450. In addition, a circular opening to be an injection hole 452 is formed at the center of the spacer member 450.

Figure 15:
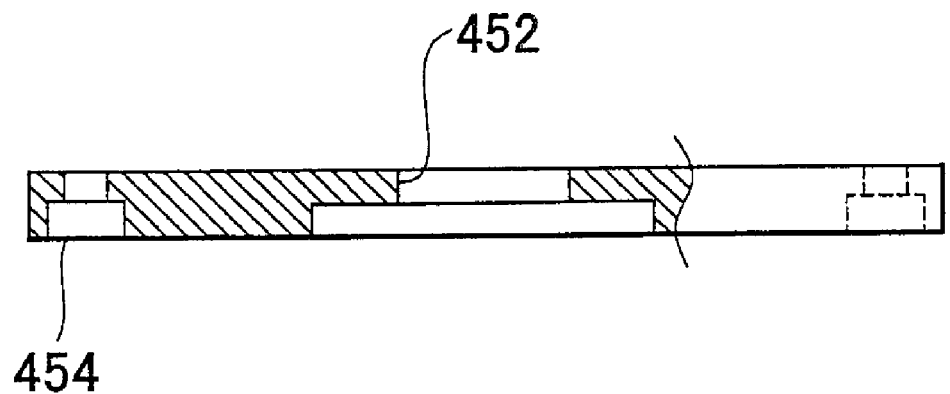
FIG. 15 is a side view showing a shape of the spacermember 450.

FIG. 15 is a side view showing a shape of the spacer member 450, and apart of that shows a cross-sectional shape of the spacer member 450. As shown in FIG. 15, the threaded hole 454 includes portions having the inside diameters different from each other. Thereby when a screw 630 described later is inserted, the head of the screw is accommodated in the threaded hole 454, so that the under surface can be planarized.

Figure 16:
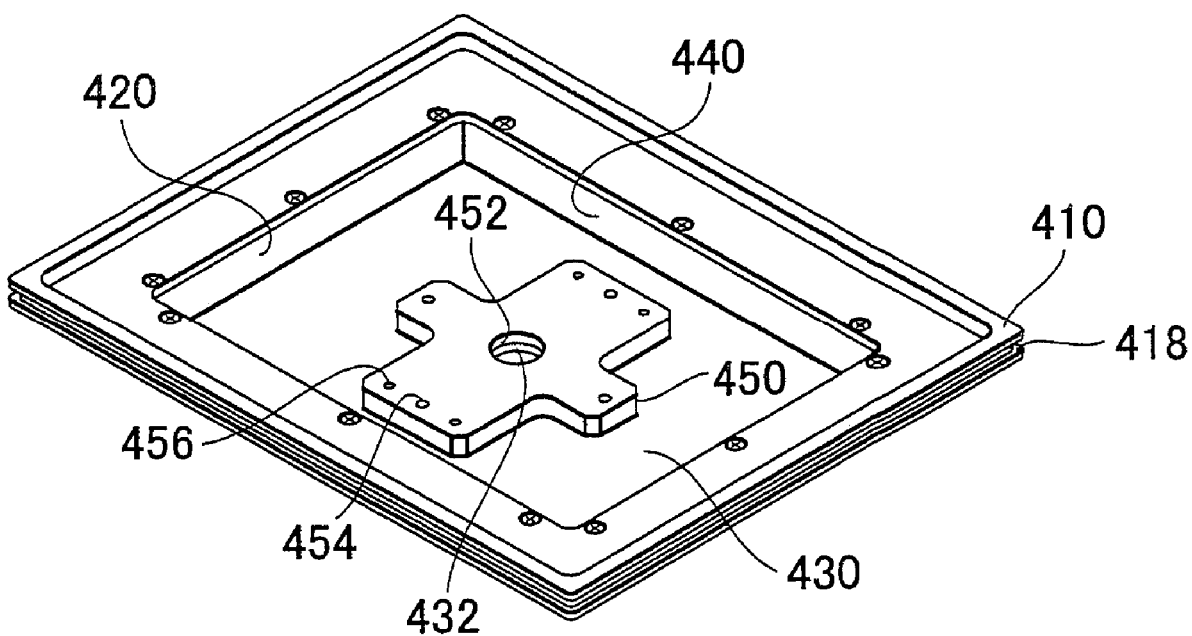
FIG. 16 is a drawing showing the assembled cover member 400 to which the spacer member 450 is attached.

FIG. 16 is a perspective view showing the assembled cover member 400 in which the spacer member 450 is attached to the bottom section 430, which is assembled in the built-up structure as shown in FIG. 13. As shown in FIG. 16, the spacer member 450 is disposed at the center of the bottom section 430. Accordingly, the injection hole 452 of the spacer member 450 is aligned with the injection hole 432 of the bottom section 430 to form a continuous hole.

Here, the stiffener plate 520 is fixed by inserting the screw 478 (not shown in the figure) through the threaded hole 438 formed on the bottom section 430 into the threaded hole 456 of the stiffener plate 520. Meanwhile, the threaded hole 454 is disposed concentrically with the work hole 439 of the bottom section 430, however, it is not used in this stage.

In addition, it is preferred that any of the frame 410, the side walls 420 and 440, the bottom section 430 and the spacer member 450 constituting the cover member 400 is made of a material having a low thermal conductance with the view of the function. In addition, a material having temperature resistance to an environmental test executed within about −55 degree centigrade to 150 degree centigrade. Specifically, engineering plastic such as POM and PEI can be used as well as glass epoxy similar to the substrate 500, for example, however, it is not limited to those. In addition, a composite material obtained by laminating a plurality of materials in order to satisfy both of adiathermanous and mechanical strength can be used.

Figure 17:
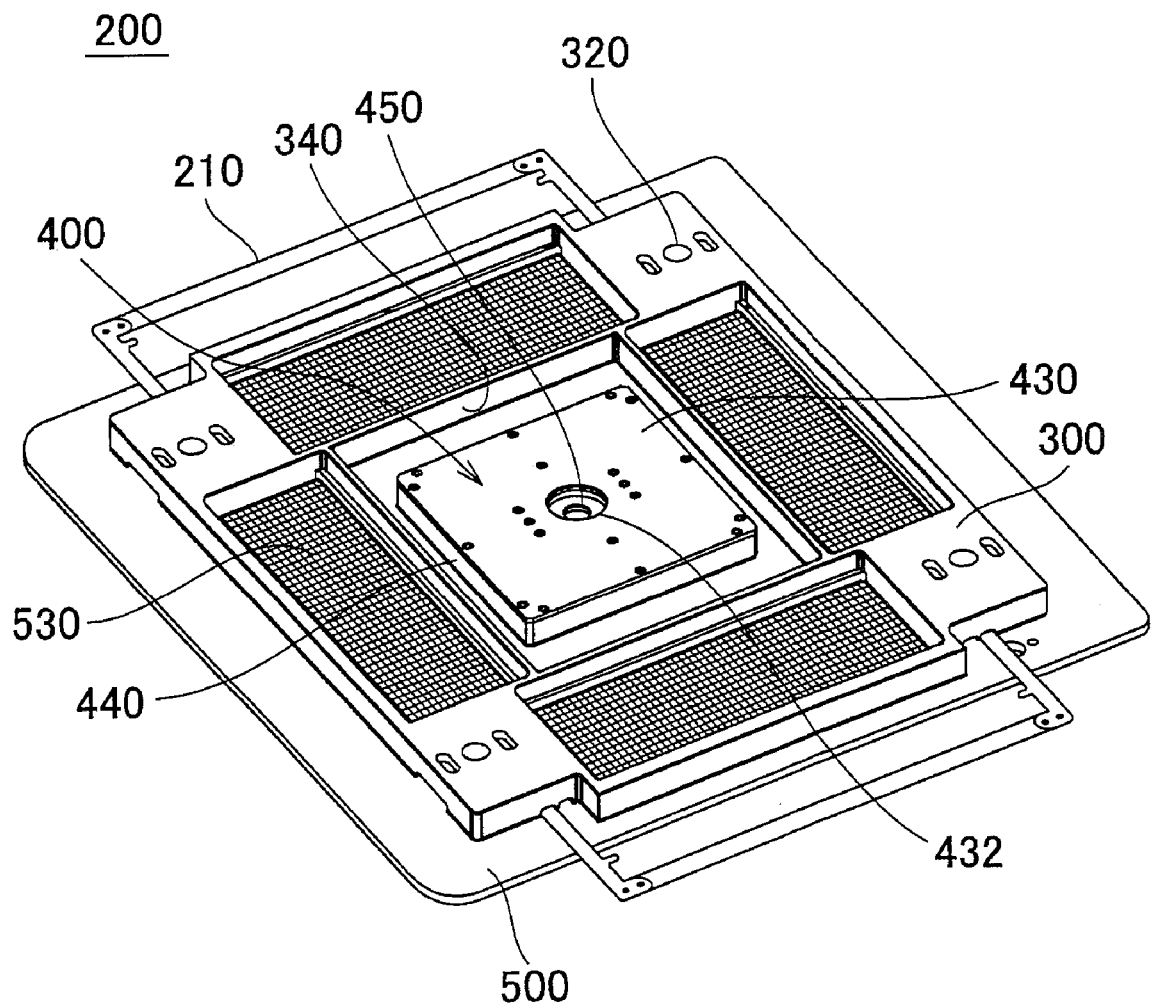
FIG. 17 is a perspective view showing the rear surface of the performance board 200 to which the cover member 400 including the spacer member 450 is attached, which is viewed from an obliquely upward direction.

FIG. 17 is a perspective view showing a condition that the cover member 400 including the spacer member 450 as shown in FIG. 16 is attached to the performance board 200 as shown in FIG. 6. As shown in FIG. 17, the cover member 400 is mounted into center hole section 340 of the stiffener 300 and covers the rear surface of the substrate 500 including the stiffener plate 520. Thereby the rear surface of the substrate 500 on which the sockets 510 are mounted is thermally insulated from the surrounding environment, so that the thermostatic chamber 124 can be thermally stabilized.

In addition, the injection hole 432 of the cover member 400 is disposed concentrically with the injection hole 452 of the spacer member 450 and the injection hole 522 of the stiffener plate 520. Accordingly, all of the injection hole 432 of the cover member 400, the injection hole 452 of the spacer member 450 and the injection hole 522 of the stiffener plate 520 are communicated, so that the injected dry air can be directly blown against the rear surface of the substrate 500. Thereby dew condensation can be effectively prevented from being formed on the rear surface of the region on which the sockets 510 are attached.

Here, a heating means may be further provided on the inside of the cover member 400. Since the heating means generates heat inside the cover member 400 and mainly heats the rear surfaces of the sockets 510, it can be utilized to control temperature of the devices under test 160 when a test of heating the devices under test 160 is executed. Thereby the heat quantity dissipated from the sockets 510 is compensated and temperature of the devices under test 160 can be more accurately controlled.

In addition, the cover member 400 is mounted on the inside of the center hole section 340 of the stiffener 300. Accordingly, the cover member 400 can be added without changing the shape of the test heads 130 side.

As described above, the performance board 200 which attached to the test head 130 of the semiconductor test apparatus 100 and on which the devices under test 160 are mounted is provided. The performance board 200 includes: the substrate 500; the sockets 510 which are attached to the surface of the substrate 500 and on which the devices under test 160 are mounted; the contact pad 530 which is attached to the rear surface of the substrate 500 and coupled to the test heads 130 side; and the cover member 400 which is attached to the rear surface of a region of the substrate 500 on which the sockets 510 are mounted and encloses the region on the rear surface of the substrate 500 so as to thermally insulate from the outside. Thereby a structure for thermally insulating the devices under test 160 by the cover member 400 which is simple and compact can be provided. The performance board 200 with the cover member 400 has the effective size substantially the same as that of the performance board 200 without the cover member 400, so that it can be mounted on any existing test head 130 and used.

In other words, if any cover member 400 is added to the existing performance board 200 without the cover member 400, the resultant performance board 200 can be treated as the performance board 200 originally having the cover member 400, and the similar effect can be achieved.

As described above, the cover member 400 is provided, which is attached to the performance board 200 of the semiconductor test apparatus 100 including: the substrate 500; the sockets 510 which are attached to the surface of the substrate 500 and on which the devices under test 160 are mounted; and the contact pad 530 which is attached to the rear surface of the substrate 500 and coupled to the test heads 130 side, and encloses the rear surface of a region of the substrate 500 on which the sockets 510 are mounted so as to thermally insulate the region from the outside. Thereby the cover member 400 which can be attached to the performance board 200 is individually provided, and the effect of the cover member 400 can be provided to also the existing performance board 200.

Further, the cover member 400 can be detachably attached to the performance board 200. Thereby when a temperature test is not executed, the cover member 400 is detached, so that workability of the rear surface of the performance board 200 can be improved. In addition, the cover member 400 may be attached to the existing performance board 200 without the cover member 400. Accordingly, the semiconductor test apparatus 100 being capable of executing a test of changing the temperature of the devices under test 160 can be provided at a low price.

Figure 18:
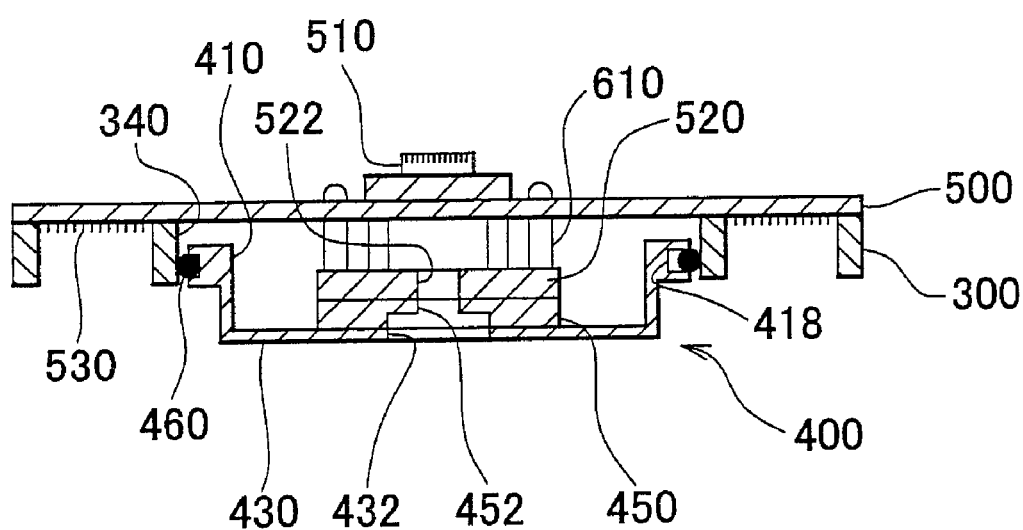
FIG. 18 is a cross sectional view showing a cross sectional structure of the performance board 200 as shown in FIG. 17.

FIG. 18 is a cross sectional view showing a cross sectional structure of the performance board 200 as shown in FIG. 17. As shown in FIG. 18, the stiffener plate 520 attached to the substrate 500 of the performance board 200 and the spacer member 450 attached to the cover member 400 are tightly in contact with each other.

Thus, the cover member 400 can include therein the spacer member 450 having one surface which is abutted on the stiffener plate 520 while being attached to the performance board 200. Thereby the mechanical strength of the cover member 400 is improved, and also the strength of the stiffener plate 520 can be improved.

In addition, at both ends of the cover member 400, the O ring 460 tightly seal between the cover member 400 and the stiffener 300. Thereby the under surface of the substrate 500 is enclosed by the cover member 400 except for the injection holes 432, 452 and 522.

As described above, the cover member 400 is sealingly attached to the stiffener 300 through the O ring 460 made of an elastic material. Thereby the air tightness between the cover member 400 and the stiffener 300 can be improved. In addition, the cover member 400 can be easily attached.

In addition, the cover member 400 is attached to the stiffener 300 while thermally insulating. Thereby the performance of the cover member 400 as an insulation material can be improved.

Moreover, since the cover member 400 is press-fitted into the center hole section 340 of the stiffener 300 against the elasticity of the O ring 460, the cover member 400 is not dropped out the performance board 200. In other words, the cover member 400 can be attached and directly fitted by only being pressed into the center hole section 340 of the stiffener 300.

As described above, the cover member 400 can be fixed by being press-fitted into the center hole section 340 formed in the stiffener 300. Thereby the cover member 400 can be easily attached. In addition, since the stiffener 300 has a high strength, the cover member 400 can be firmly pressed thereto. Accordingly, the performance board 200 is not damaged when the cover member 400 is attached or detached.

Moreover, since the cover member 400 is fixed to the stiffener 300, the frame 410 of the cover member 400 is spaced from the rear surface of the substrate 500. Elements such as a resistor and a capacitor are mounted on the rear surfaces of the sockets 510 in many semiconductor tests, however, since the cover member 400 does not occupy the rear surface of the substrate 500, the inside of the center hole section 340 can be widely utilized.

As described above, the performance board 200 further includes the stiffener 300 which compensates flexural rigidity of the substrate 500, and the cover member 400 is fixed to the stiffener 300. Thereby the cover member 400 can be firmly fixed without occupying the area on the rear surface of the substrate 500. In addition, the cover member 400 can be firmly fixed because the stiffener 300 has a high mechanical strength. Moreover, since the cover member 400 can be attached to the substrate 500 while spacing from each other, the adiathermanous around the sockets 510 of the substrate 500 inside the center hole section 340 of the stiffener 300 can be further improved.

Figure 19:
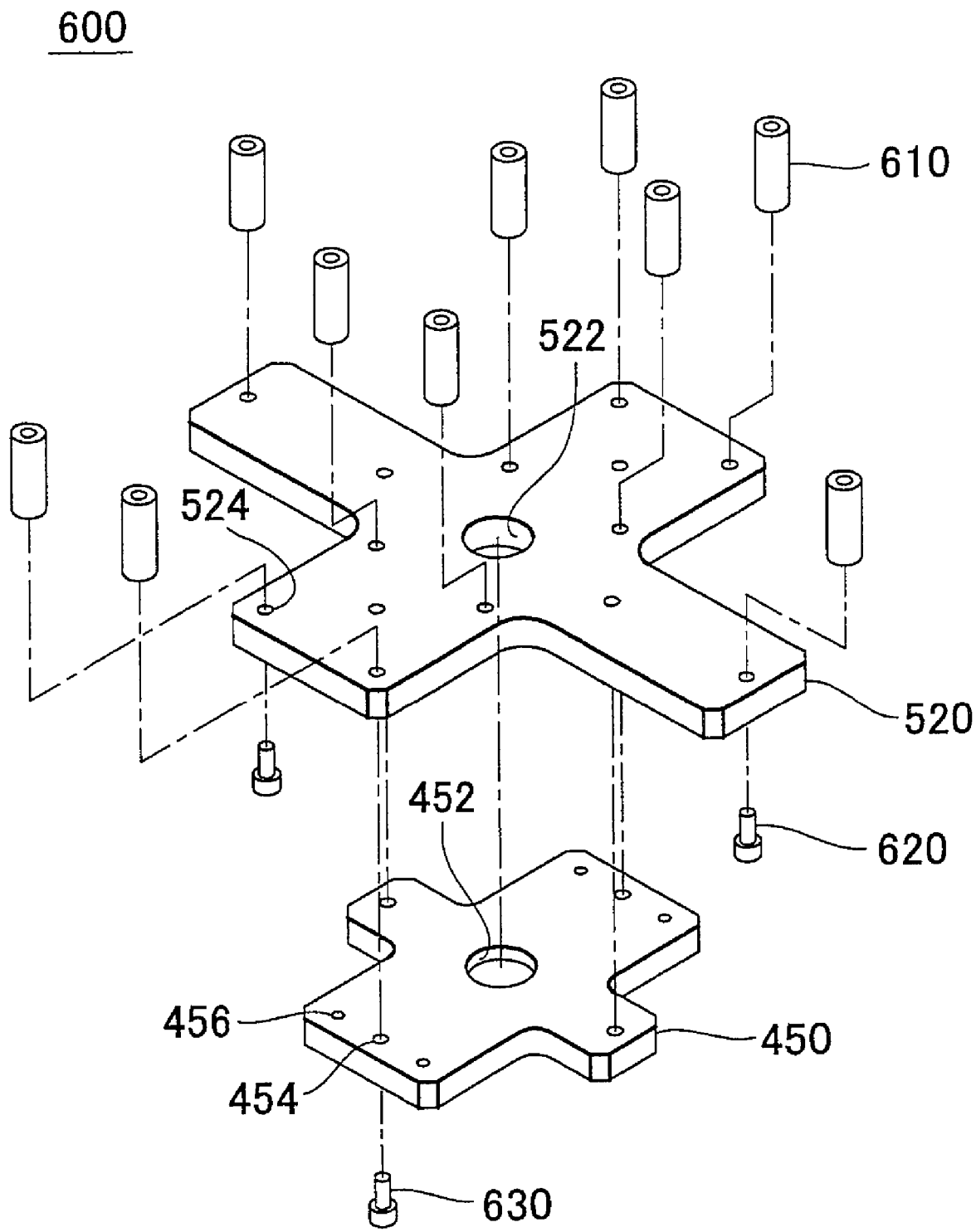
FIG. 19 is an exploded perspective view explaining a fixing structure 600 that a stiffener plate 520 and the spacer member 450 are fixed to each other on the performance board 200 as shown in FIG. 17.

FIG. 19 is an exploded perspective view explaining a fixing structure 600 for fixing mutually stiffener plate 520 and the spacer member 450 on the performance board 200 as shown in FIG. 17. Here, the drawing is omitted, and since the spacermember 450 has been already attached to the bottom section 430 of the cover member 400, the following operation is nothing more or less than threadedly attaching the cover member 400 to the stiffener plate 520 through the spacer member 450.

As shown in FIG. 19, the stiffener plate 520 is attached to the substrate 500 through a curler 610. Here, the drawing is omitted, and the screw (not shown in the figure) through the substrate 500 is threadedly inserted into the upper end of the curler 610. Meanwhile, the stiffener plate 520 is attached to the substrate 500 by threadedly inserting a screw 620 through the threaded hole 524 into the bottom end of the curler 610. Thus, the stiffener plate 520 is attached to the substrate 500 while spacing from the substrate 500. Thereby a working area for which additional elements are coupled to the rear surfaces of the sockets 510 is ensured.

By threadedly attaching the screw 630 inserted into it's threaded hole 454 to the above-described stiffener plate 520, the spacer member 450 can be fixed to the stiffener plate 520. The screw 630 can be inserted through the work hole 439 of the bottom section 430 and fastened. Thus, the cover member 400 with the spacer member 450 can be surely fixed to the performance board 200. In addition, the cover member 400 is easily detached by removing the screw 630. Moreover, since the performance board 200 and the cover member 400 are tightly engaged with each other, the whole strength is increased.

As described above, the substrate 500 includes the stiffener plate 520 which compensates the flexural rigidity of the region on which the sockets 510 are mounted, which is attached to the rear surface of the substrate 500, and the cover member 400 can be fixed to the stiffener plate 520. Thereby the strength of the whole performance board 200 is improved, and sure attachment and easy detachment can be provided.

Moreover, the cover member 400 also can be threadedly attached to the performance board 200. Thereby the cover member 400 can be firmly fixed and also easily detached.

While the aspects of the invention have been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A performance board which is attached to a semiconductor test apparatus and on which devices under test are mounted, comprising:
   a substrate;
   sockets which are attached to the surface of the substrate and on which devices under test are mounted;
   an adiathermic cover member attached to the rear surface of a region of the substrate on which the sockets are mounted;
   a stiffener plate attached to the rear surface of the region of the substrate on which the sockets are mounted; and
   a stiffener attached to the rear surface of the substrate for compensating flexural rigidity of the substrate,
   wherein the cover member is fixed to said stiffener.

2. The performance board as set forth in claim 1 that is attached to a test head of the semiconductor test apparatus.

3. The performance board as set forth in claim 2, further comprising a connector electrically connected to the sockets through a wiring formed on the substrate and attached to the rear surface of the substrate so as to be coupled to the test head side.

4. The performance board as set forth in claim 1, wherein the cover member encloses the region of the rear surface of the substrate on which the sockets are mounted to thermally insulate the region from the outside.

5. The performance board as set forth in claim 1, wherein the cover member is detachably attached to the performance board.

6. The performance board as set forth in claim 1, wherein the cover member is fixed by being press-fitted into a concavity formed in the stiffener.

7. The performance board as set forth in claim 1, wherein the cover member is sealingly attached to the stiffener through an elastic member made of an elastic material.

8. The performance board as set forth in claim 1, wherein the cover member is attached to the stiffener through an adiathermic material.

9. The performance board as set forth in claim 1, wherein the cover member is fixed to the substrate while spacing from the substrate.

10. The performance board as set forth in claim 1, wherein the cover member is threadedly attached to the performance board.

11. The performance board as set forth in claim 1, wherein
    the stiffener plate compensates flexural rigidity of the substrate on the region on which the sockets are mounted, and
    the cover member is fixed to the stiffener plate.

12. The performance board as set forth in claim 11, wherein the cover member includes therein a spacer having one surface abutted on the stiffener plate while being attached to the performance board.

13. The performance board as set forth in claim 1, wherein the cover member further includes therein a heating means.

14. The performance board as set forth in claim 1, wherein the cover member includes therein an injection hole for injecting a dry air.

15. The performance board as set forth in claim 1, further comprising a spacer member attached to the cover member, wherein the stiffener plate and the spacer member are tightly in contact with each other.

* * * * *